United States Patent [19]
Marek

[11] Patent Number: 6,121,776
[45] Date of Patent: Sep. 19, 2000

[54] SUPERCONDUCTING HYBRID-RESONATOR FOR RECEIVING NMR-SIGNALS

[75] Inventor: Daniel Marek, Möriken, Switzerland

[73] Assignee: Bruker AG, Faellanden, Switzerland

[21] Appl. No.: 09/118,943

[22] Filed: Jul. 20, 1998

[30] Foreign Application Priority Data

Aug. 2, 1997 [DE] Germany .......................... 197 33 574

[51] Int. Cl.$^7$ .................................................. G01V 3/00
[52] U.S. Cl. ........................................ 324/318; 324/309
[58] Field of Search .................... 324/318, 322, 324/309

[56] References Cited

U.S. PATENT DOCUMENTS 5,258,710 11/1993 Black et al. ............................. 324/309
5,585,723 12/1996 Withers .................................. 324/318
5,689,187 11/1997 Marek .................................... 324/318

FOREIGN PATENT DOCUMENTS 0 738 897 A1 10/1996 European Pat. Off. .
4218635 12/1993 Germany .

*Primary Examiner*—Christine K. Oda
*Assistant Examiner*—Brij B. Shrivatav

[57] ABSTRACT

An RF resonator for resonant transmission and/or reception of RF-pulses at a desired resonance frequency into or out of a sample (5) within an investigational region in a homogeneous magnetic field $B_0$ of an (NMR)-apparatus has at least two spatially separated superconducting components (1, 1a, 1b, 1c, 1d) which do not constitute, either alone or in combination, a closed resonance system capable of resonating at the desired resonant frequency. Normally conducting connection elements (2a, 2b) are therefore provided to connect the superconducting components conductively and/or capacitively in such a fashion that the superconducting components, together with the normally connecting components, form one or a plurality of closed resonance systems capable of resonating at the desired resonant frequency. In this fashion, despite use of flat superconducting materials, a substantially higher fill factor, a very good homogeneity of the $B_0$-filed, and a signal-to-noise ratio corresponding to that of prior art are achieved but with high RF-power and a short excitation pulse decay time.

17 Claims, 10 Drawing Sheets

PRIOR ART

SUPERCONDUCTING HYBRID-RESONATOR FOR RECEIVING NMR-SIGNALS

This application claims Paris Convention priority of German application No. 197 33 574.8 filed Aug. 2, 1997, the complete disclosure of which is hereby incorporated by reference.

BACKGROUND OF THE INVENTION

The invention concerns a radio frequency (RF) resonator for the resonant transmission and/or reception of RF-signals at a desired resonance frequency into or out of a sample in an investigation volume within a homogeneous magnetic field $B_0$ of a nuclear magnetic resonance (NMR) apparatus, wherein the RF resonator comprises superconducting components.

A radio frequency resonator of this type is per se known in the art from U.S. Pat. No. 5,585,723.

One of the most important requirements in NMR spectroscopy is the achievement of high sensitivity for the NMR signal, i.e. a high signal-to-noise ratio (S/N ratio).

The magnitude S of the signal is primarily dependent on the geometrical construction of the resonator, and on how close the resonator surrounds the sample. The temperature of the resonator thereby plays a less important role.

In contrast thereto, the noise voltage of the resonator is a strong function of temperature. The resonator comprises inductive and capacitive components which are in resonance at the desired frequency. The noise voltage N is produced in the RF loss resistance $R_V$ of the resonator and comprises the noise in the capacitive portion of the resonator (quite small and can practically be neglected) and in the dominating inductive portion. It is thereby this latter noise portion which is most important for the resonator noise and this component is dependent on both the temperature T as well as on the temperature-dependent RF loss resistance $R_V(T)$:

$$N \propto \sqrt{T \cdot R_V(T)}$$

The temperature dependence of the S/N-ratio is given in the following equation:

$$S/N \propto \frac{S}{\sqrt{T \cdot R_V(T)}}$$

A reduction in the temperature T of the resonator leads to an increase in the S/N ratio due to two effects. First of all, due to the lower temperature T in the denominator of the above expression and, second of all, due to the loss resistance $R_V(T)$ which is likewise smaller at lower temperatures.

It is therefore advantageous to cool the resonator down to a very low temperature e.g. to temperatures in the range of 4K to 20K. If one chooses superconducting material to construct the inductive portion of the resonator, particularly good results are achieved, since, with a superconductor, the RF loss resistance $R_V(T)$ is substantially smaller than with a normally conducting metal such as copper. In this manner, the S/N ratio, as given in the above equation, can be very high.

Modern NMR spectroscopy measuring methods use, almost exclusively, RF pulses for the excitation of the magnetic spin system with a subsequent Fourier transformation. Excitation is normally effected using the same resonator with which the NMR signal is subsequently detected. It is therefore important, after generation of the RF pulse, for the resonator to be free of current flow as quickly as possible in order to optimize detection of the NMR signal.

However, resonators having very small losses also have very narrow resonance lines and therefore very long excitation pulse decay times. A certain time $t_1\%$ must pass before the resonance current decays e.g. to 1% of its initial value:

$$t_1\% = 9.21 \, L/R(T)$$

where L is the resonator inductance.

This equation clearly shows that the smaller the loss resistance $R(T)$ of the resonator the longer the decay time.

In order to be able to apply modern measuring methods, modern day applications utilize very short RF excitation pulses (hard pulses) which can assume values on the order of 10 μs and less. If one notes that the product between the pulse duration of the excitation pulse and the field amplitude at the location of the sample must have a defined optimum value, these short excitation pulses lead to very large field amplitudes and therefore to extremely high electric RF currents in the resonator. These must first decay sufficiently before switching to detection. Unfortunately, delayed detection results, however, in distorted base lines and distorted lines in the NMR spectrum. With superconducting resonators, additional loss resistance can therefore be advantageous to reduce the decay time of the excitation pulse. These loss resistances can, however, not be too large, since this would lead to unacceptable deterioration of the S/N-ratio. For this reason, these methods are only applicable if the S/N-ratio is already trimmed to a very high value e.g. through use of a suitable geometry for the resonators to provide a particularly high fill factor.

Since construction of superconducting NMR resonators is a new development direction in NMR, there are not a large number of relevant publications. The above mentioned U.S. Pat. No. 5,585,723 represents the present prior art. The superconducting resonator (see FIGS. 16a and b) is introduced as a complete resonant system, i.e. with both its inductive as well as capacitive components, on a flat crystal plate 18a which is coated on one side with a superconducting material 19a and is mounted close to the sample 5.

In this case, the resonator must be large compared to the diameter of the sample, in order that the produced RF field be sufficiently homogeneous in the vicinity of the sample. An improvement in this regard can be achieved through the combination of two identical resonators 19a and 19b which are disposed as Helmholtz-resonator pairs to the left and the right of the sample 5. One thereby not only achieves a more homogeneous RF field but also a stronger coupling into the sample, i.e. an improved fill factor.

Such a Helmholtz-resonator configuration is a resonant-capable system having two prominent resonant frequencies: an upper one with the currents in both resonators flowing in opposite directions, and a lower one in which the currents flow in the same direction. For NMR applications, the lower resonant frequency must be utilized since only this mode produces the desired homogeneous RF field of the location of the sample. The resonators are normally inductively coupled to pass the NMR-signal to the detection system of the NMR spectrometer.

Modern day systems use high-temperature superconductors (HT superconductor) as the superconducting material such as e.g. YBCO whose electrical properties are weakly dependent on the static magnetic field $B_0$. These HT superconductors are generally deposited as thin layers on a crystal plate so that the crystal grains from which these conductors are formed are all oriented in the same direction only in this manner can the HT superconductor achieve the best electrical properties. The surface of the crystal plate serves as a substrate upon which the crystalline superconducting layer is introduced and forced to assume the orientation of the crystal plate. It is therefore advantageous to use a crystal plate whose crystal structure is as close to that of the superconductor as possible. If this plate is to be also used as a dielectric for the capacitive components of the resonator, it should also have good dielectric RF properties. All these requirements are e.g. fulfilled by both $LaAlO_3$ and sapphire crystals. It can also be advantageous if these plates are good thermal conductors in order to guarantee a better cooling of the superconducting layer. Sapphire also fulfills this requirement.

The use of HT superconductors has, however, an additional advantage. Due to their high critical temperature in the vicinity of 100K, there is a larger temperature region available within which the good superconducting RF properties of the resonator are effective. This allows for increased flexibility when adjusting the operating temperature.

Such crystal plates are only available today in the form of flat plates and therefore the resonator must also have a flat structure. The plate can be cooled to a cryogenic temperature using a cooled helium gas flow having a temperature below 20K.

The geometric configuration of modern conventional resonators has the serious disadvantages described below.

The resonator configurations comprise one or two individual resonators which are built on one or two crystal plates, with each individual resonator being a complete resonance system. If one assumes the optimum configuration, namely a Helmholtz-resonator (see FIGS. 17a/b), then one would dispose this Helmholtz-resonator as closely as possible around the sample to achieve as high a fill factor as possible. Since, however, the Helmholtz-pair consists essentially of two flat structures which are poorly adjusted to the cylindrical geometry of the sample, one nevertheless fails to achieve a large fill factor. This is particularly evident in the corner regions of the two resonators which are relatively far from the sample. Only the horizontal transverse connections 20 are in close proximity to the sample and are more strongly coupled thereto.

The horizontal transverse connections 20 have an additional very serious disadvantage. They are not parallel to the $B_0$-field, but perpendicular thereto and this is something which should be avoided if it all possible, since it leads to a deterioration of the homogeneity of the $B_0$-field. In order to limit this deterioration, it is necessary for the superconductor to be very narrow, i.e. to be made with as little material as possible. However, the maximum possible RF current below which a linear dependence between the RF current and the RF field obtains, is thereby reduced as is the associated maximum possible RF field. In order to generate a particular NMR flip angle, it is therefore necessary to tolerate longer pulse times which leads to undesirable spectra for a plurality of NMR experiments.

An additional disadvantage is caused by the vertical longitudinal connections 21 of the resonator which, for reasons of space, are very close to an RF shielding 6. They therefore produce eddy currents in the shields and associated RF losses which transform back into the resonator. In this manner, although the decay time of the excitation pulse is advantageously reduced, the signal-to-noise ratio simultaneously deteriorates. Since, however, the fill factor of such a Helmholtz configuration is already poor, the negative influence of the RF losses on the S/N-ratio is particularly noticeable.

In contrast thereto, it is the purpose of the present invention to create an RF resonator for NMR applications having the above mentioned features which, despite the use of superconducting materials, facilitates a significantly higher fill factor, with the homogeneity of the $B_0$ field not being deteriorated and the S/N-ratio being particularly high.

SUMMARY OF THE INVENTION

This purpose is achieved in accordance with the invention in that the RF resonator comprises at least two spatially separated superconducting components which neither separately nor collectively form a closed resonance system which can oscillate at the desired resonant frequency, with normally conducting connection elements being provided to couple the superconducting components in a conducting and/or capacitive fashion in such a manner that the superconducting components, together with the normally conducting connection elements, form one or a plurality of closed resonance systems which can resonate at the desired resonance frequency.

The resonators in accordance the invention always comprise superconducting and normally conducting materials. The superconductor is preferentially a high temperature superconductor such as e.g. YBCO.

The teaching in accordance with the invention is based on the following fundamental observations.

1) The RF-resonator comprises at least two superconducting components which, near the desired frequency and when viewed alone, do not represent a closed current-carrying resonance system. These components are connected together via normally conducting elements in either a conductive or capacitive manner and only then form an internally closed resonance system resonant at the desired frequency.

One single resonance system is preferentially formed from the superconducting components and the normally conducting connection components. It is, however, also possible to have a plurality of closed resonance systems which are, however, then coupled to each other during operation. In this case, the individual resonance systems must be tuned in such a fashion that they are only approximately in resonance at the desired frequency. The actual desired resonance frequency results from the coupling and the resulting beat frequencies.

2) The superconducting components consist essentially of elongated narrow plates which are all oriented parallel to the $B_0$-field and distributed on the surface of a fictitious cylinder whose axis is parallel to the $B_0$-field an which coincides with the axis of the sample.

In this manner, the resonator is compact and closely surrounds the sample. One therefore achieves a higher fill factor (and thereby a higher sensitivity) and there is more free space to e.g. install gradient coils for special NMR-experiments. In addition, all superconducting layers are parallel to the $B_0$-field so that the width of the layer can be substantially larger without having the homogeneity of the $B_0$-field deteriorate to an unacceptable extent. The wider layers allow larger RF-currents and therefore larger RF-fields and associated shorter RF-pulses.

3) The normally conducting connection elements consist essentially of two cylindrical rings of high electrical conductivity disposed at the upper and lower ends of the superconducting components.

The use of normally conducting elements introduces RF-losses resulting in shorter decay times. The associated loss in sensitivity is compensated through the higher fill factor without having to tolerate deteriorated $B_0$ homogeneity.

4) The superconducting components and the associated conductively or capacitively coupled connection elements constitute a so-called "Bird Cage" resonator.

The "Bird Cage" resonator is, as a geometrical configuration, per se known in the art but is realized herein for the first time using normally conducting and superconducting components. The required know how for configuring "Bird Cage" resonators using superconducting elements does not exist to date. The present invention discloses, for the first time, how this is to be done.

"Bird Cage" resonators have substantial advantages. They produce a very homogeneous RF-field and can, in addition, be configured as quadrature detectors, i.e. as detectors which can be optimized to detect rotating fields. This detection method is particularly advantageous in NMR-measurements, since the NMR-signals radiated by the atomic nuclei also generate a rotating field. Quadrature detectors are therefore more appropriated for receiving an NMR-signal and deliver a S/N-ratio which, in the ideal case, can be larger by a factor $\sqrt{2}$ than that of a conventional detector. Further description of the rotational field detector follows below.

To conclude:

The resonator in accordance with the invention is preferentially a "Bird Cage" resonator using hybrid technology (i.e. it consists essentially of both normally conducting and superconducting elements) which facilitates a sensitivity corresponding to that of prior art, but is substantially better than prior art with regard to its good $B_0$-homogeneity, short decay times and short RF-pulses.

Further advantages of the invention can be derived from the description and the drawing. The above mentioned features and those to be described further below can be utilized in accordance with the invention individually or collectively in arbitrary combination. The embodiments shown and described are not to be considered exhaustive enumeration rather have exemplary character for illustration of the invention.

The invention is shown in the drawing and will be more closely described in association with the embodiments.

BRIEF DESCRIPTION OF THE DRAWING

FIG. 1b shows a plan view from above of the embodiment in accordance with FIG. 1a;

FIG. 4b shows a cut through the dashed plane shown in FIG. 4a;

FIG. 5b shows a cut through the layer of FIG. 5a in the plane given by the dashed lines of FIG. 5a.

DESCRIPTION OF THE PREFERRED EMBODIMENT

Figure 1A:
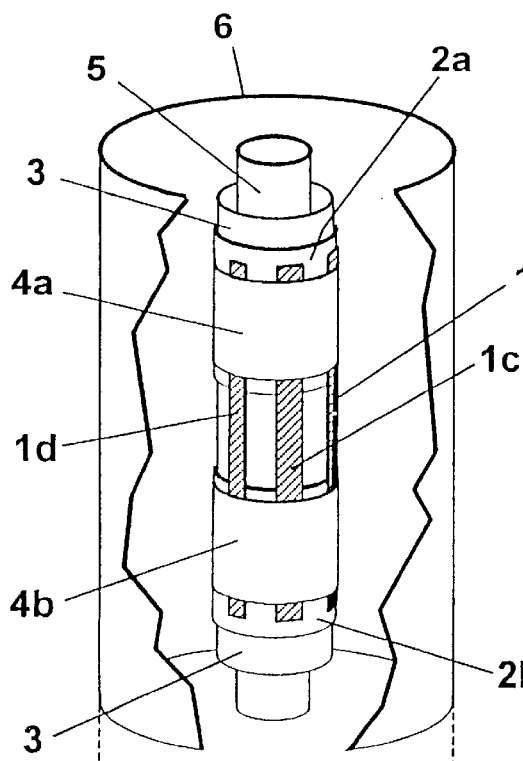
FIG. 1a shows a three dimensional representation of an embodiment of the RF-generator in accordance with the invention having cut-open shielding.
Figure 1B:
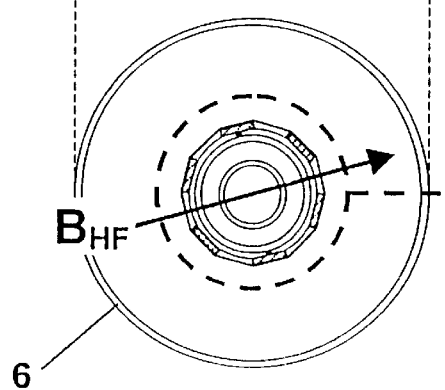

FIGS. 1a and 1b show an embodiment of a resonator in accordance with the invention. The thermal insulation surrounding the resonator and between the sample 5 and a support glass 3 is not explicitly shown. This insulation could e.g. comprise coaxial glass tubes whose intermediate space is sealed and evacuated.

Figure 3:
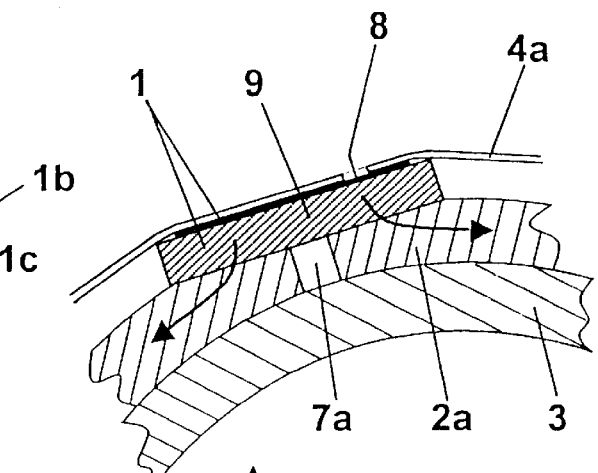
FIG. 3 shows an enlargement of the dashed region of FIG. 2.
Figure 2:
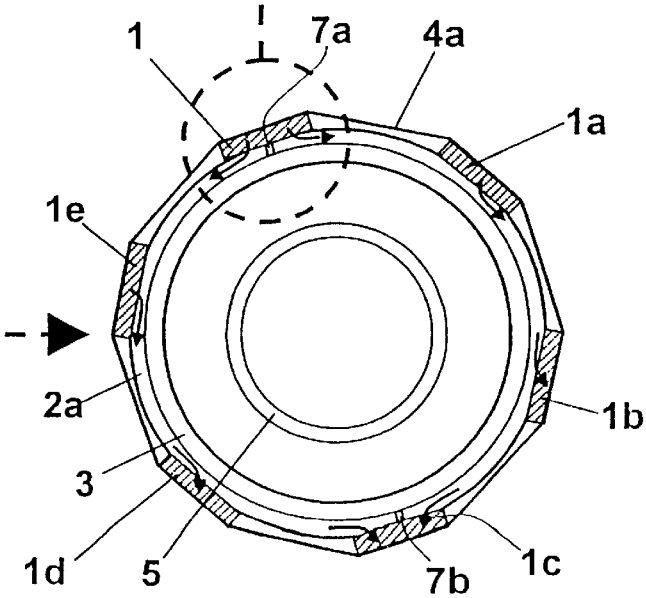
FIG. 2 shows an enlargement of the dashed region of FIG. 1b.
Figures 12, 13:
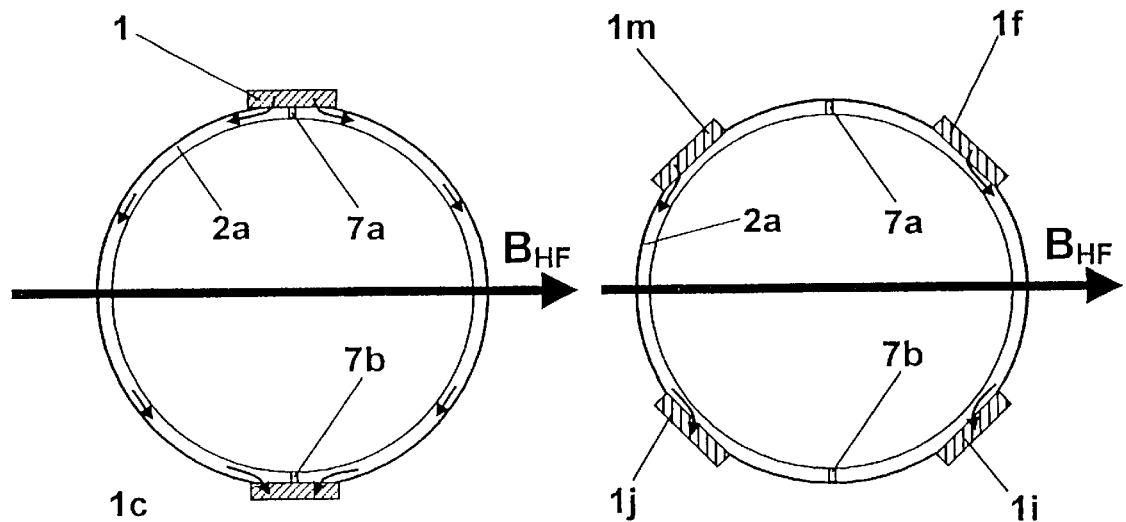
FIG. 12 shows an RF-resonator having two oppositely positioned superconducting components seen schematically in the direction of the longitudinal axis (parallel to the magnetic field $B_0$)
FIG. 13 is similar to FIG. 12, however, with four superconducting components in point-symmetric distribution.
Figures 14, 15:
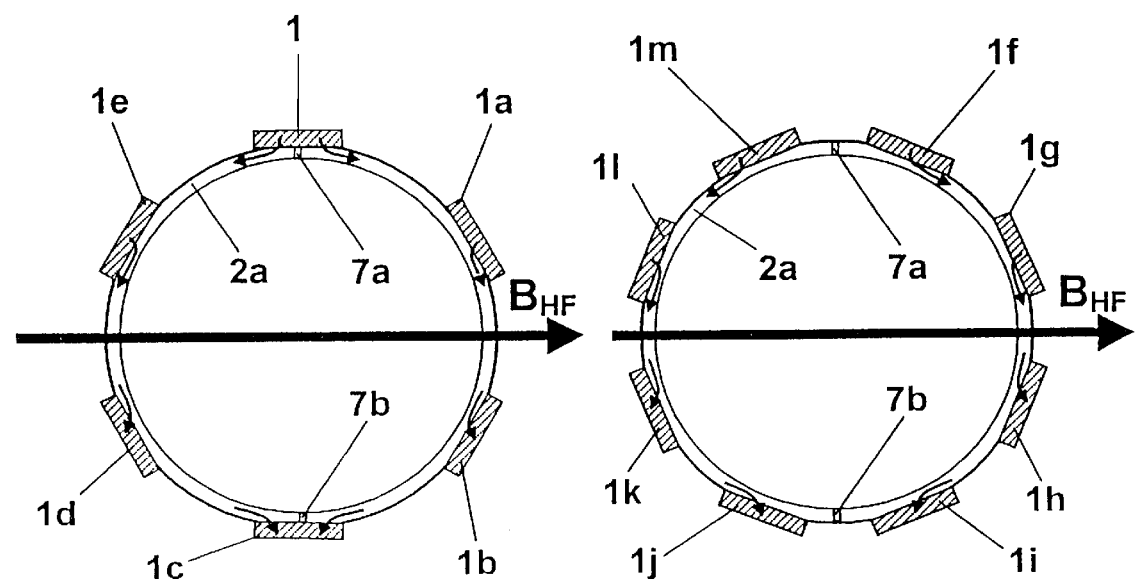
FIG. 14 is similar to FIG. 12, but with six superconducting components having a point-symmetric distribution.
FIG. 15 is similar to FIG. 12, but with eight superconducting components in point-symmetric distribution.

The resonator dimensions given below are based on a resonator built for a cylindrical sample having a diameter of 5 mm. Other samples would require correspondingly different values. The superconducting components 1, 1a, 1b through 1f constitute the main components of the resonator and extend parallel to the $H_0$-field. They consist essentially of long narrow crystal plates 9 of e.g. circa 4 mm in width, circa 45 mm long and about 0.5 mm thick, the cross-section of which is shown in FIG. 3, on whose outer side the superconducting layer 8 (approximately 0.5 mm thick) is deposited. FIG. 2 shows a six-fold configuration. However, more or less plates can be disposed on a cylindrical surface coaxial to the sample (see FIG. 12, FIG. 13 and FIG. 15).

The superconducting components 1, 1a through 1e seat on the two connecting rings 2a and 2b (e.g. 10 mm diameter and 15 mm width) which are made from a good metallic electrical conductor (e.g. 20 μm thick foil made from copper, aluminum or silver) and which surround the support glass 3. The superconducting components are pressed onto the two ring-shaped connection elements 2a and 2b via the two pressing devices 4a and 4b to also hold two connecting rings. The pressing devices 4a and 4b are e.g. Teflon bands wrapped about the superconducting components 1 through 1e. Adjacent surfaces between the superconducting layers and the two connecting rings create capacitive components in the resonator. Their capacitance values are advantageously increased by the dielectric constant of the crystal plate.

In order to support the desired resonance mode in the resonator, the two connecting rings are divided parallel to the axis at two diametrically opposed positions (interruption channels 7a and 7b). In this manner, a predefined dependence of the RF-current flow is dictated as shown by the arrows in FIG. 2. In consequence thereof, the device for coupling the NMR-signal out of the resonator can be introduced at a well defined position. If the number of superconducting components is equal to 2 m, then the two interruption channels 7a and 7b lie, for odd values of m, below the middle of a superconducting component (see FIG. 14). For m even, the channels 7a and 7b are in the middle between two superconducting components (see FIG. 15). The interruption channels 7a and 7b have an additional advantage. They reduce eddy currents in the connecting rings 2a and 2b which could occur when switching the z-gradient.

Cylindrical RF-shielding 6 usually surrounds the described configuration. This shielding must conduct well electrically so that inordinately large RF-losses are not induced in the resonator. It can consist essentially of a normally conducting material, e.g. a silver coated copper tube or, even better, a superconductor.

Figure 6:
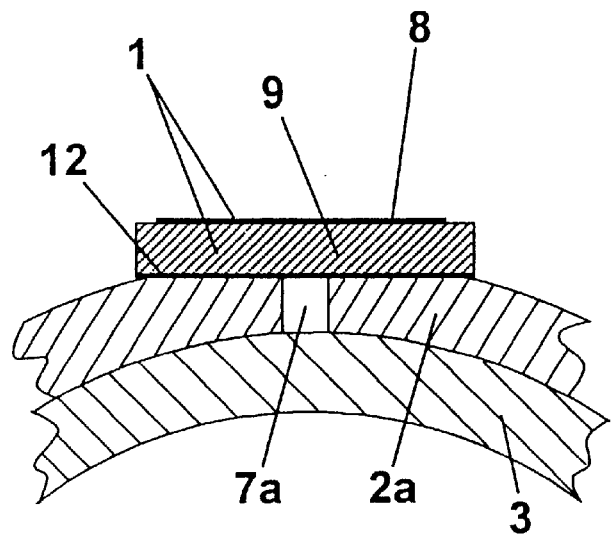
FIG. 6 shows a schematic cut through a superconducting component soldered to the connecting rings.

The connection between the superconducting components 1, 1a through 1e and the connecting rings 2a and 2b can be effected with the assistance of low susceptibility solder as shown in FIG. 6. Towards this end, the lower side of the superconducting components is coated with a metal (e.g. copper/metal coating 12) at only those locations where the components come in contact with the connecting rings. Subsequent thereto, the superconducting components are soldered to the connecting rings.

Figure 7:
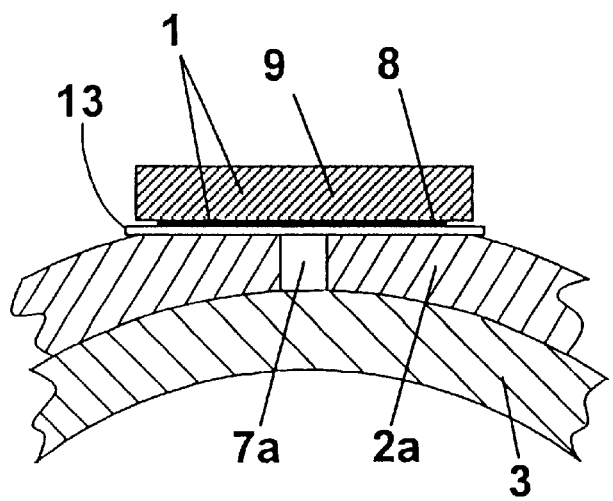
FIG. 7 shows a superconducting component which is capacitively coupled to the connecting rings via an electrically insulating leaf.

Another possibility for attaching the superconducting components is shown in FIG. 7. The superconducting components are inversely mounted, i.e. with the superconducting layer 8 directed inwardly, and thin electrically insulating plates 13 are positioned between the superconducting components and the connecting rings which serve as a dielectric for the capacitive portions of the resonator. Such a wafer must have very low dielectric losses in the RF-region and can be made from plastic (e.g. a Teflon-compound) or, still better, from a thin ceramic wafer (e.g. $Al_2O_3$) having a suitable high dielectric constant (e.g. 9.8). A pressing device 4a and 4b is utilized to mount these components.

Figure 13A:
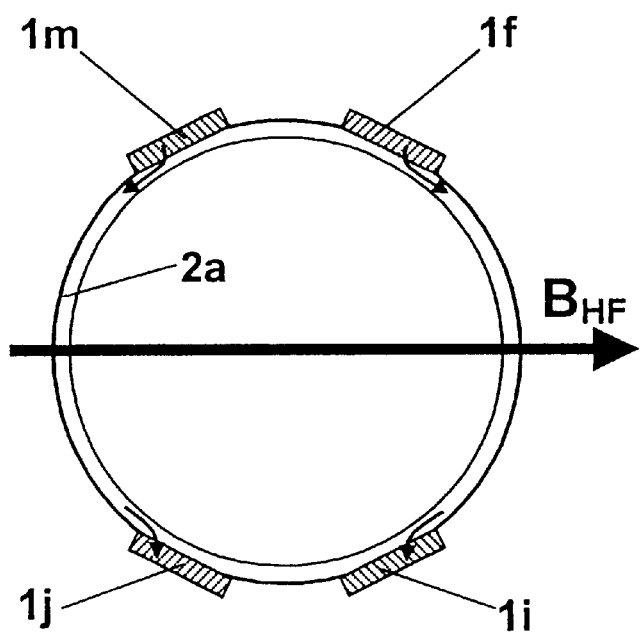
FIG. 13a is similar to FIG. 13, but with an axially symmetric distribution.
Figure 14A:
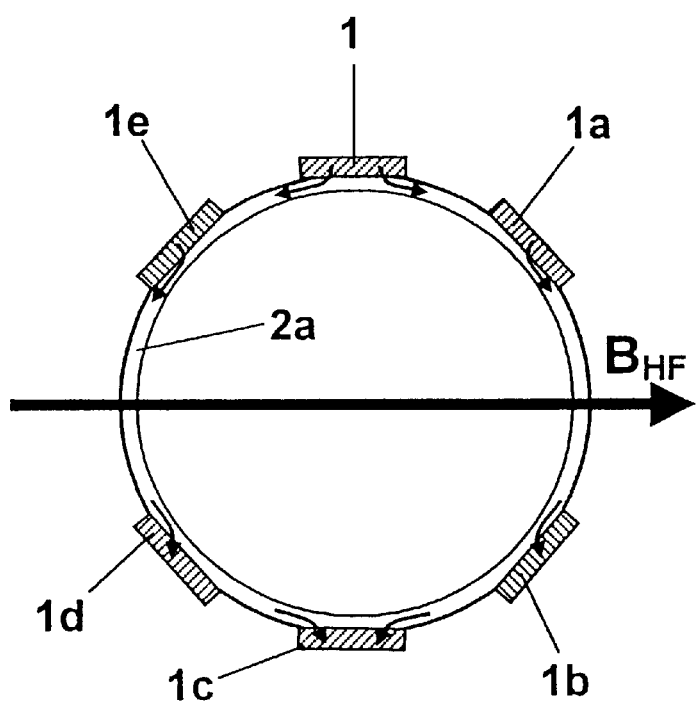
FIG. 14a is similar to FIG. 14, but with an axially symmetric distribution of six superconducting components.
Figures 16A, 17A:
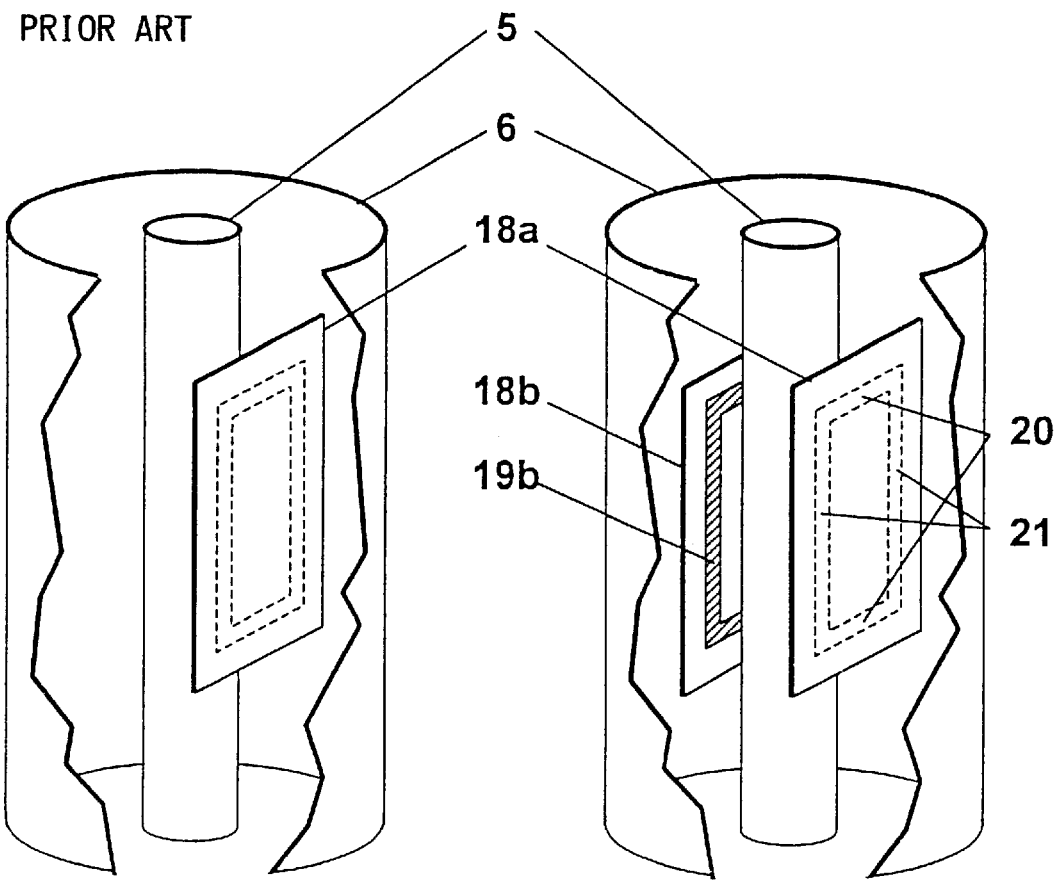
FIG. 16a is a conventional RF-resonator.
FIG. 17a is an RF-resonator according to prior art as disclosed in U.S. Pat. No. 5,585,723.
Figures 16B, 17B:
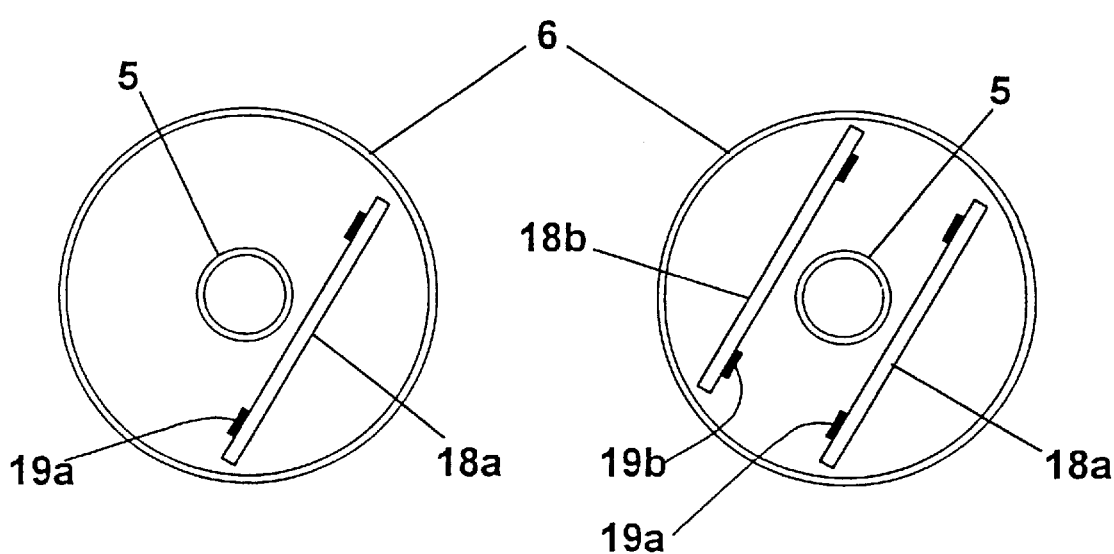
FIG. 16b is the RF-resonator in accordance with FIG. 16a schematically viewed from above.
FIG. 17b is the RF-resonator in accordance with FIG. 17a schematically viewed from above.

The configurations of the superconducting components 1, 1a, 1b through 1m shown in FIGS. 12, 13, 14 and 15 have point-symmetry. These configurations only produce an optimal homogeneous RF-field within the surrounded volume if a sufficiently large number of superconducting components are utilized. If the number of components is low e.g. only 4 or 6, then the homogeneity of the RF-field within the closed volume can be improved through symmetric displacement of the individual components. An axial symmetry is thereby generated from the original point-symmetry, as is shown in FIGS. 13a and 14a. This is particularly evident when four components are used. In this case, the Helmholtz-configuration shown in FIG. 13a, is the most optimum and not the point-symmetry configuration of FIG. 13. FIG. 14a shows the optimum configuration for the case of six superconducting components.

One should point out that, in this optimized configuration, the interruption channels 7a and 7b are no longer necessary to effect a given current distribution. The desired current distribution, also referred to as the resonant mode, necessarily results from the axial symmetry (see FIG. 13a and 14a).

FIGS. 9a, 9b, 10, 11a and 11b show various possibilities for coupling the NMR signal out of the resonator. There are in principle three types of coupling-out processes: capacitive, conductive, and inductive.

Figure 9A:
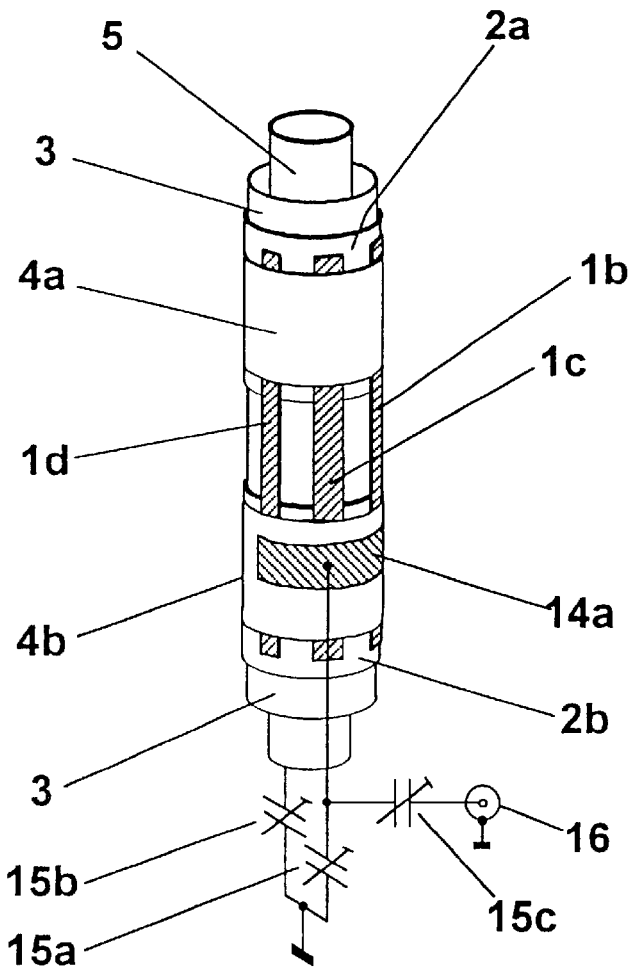
FIG. 9a shows an embodiment of the RF-resonator having a (schematically shown) capacitive coupling-out of the signal.
Figure 9B:
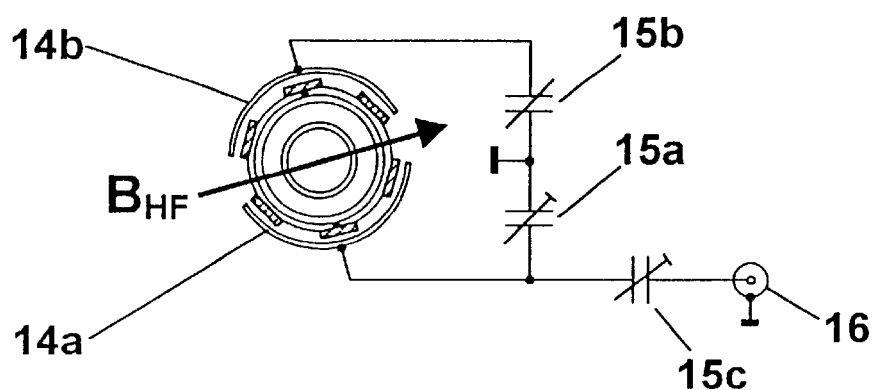
FIG. 9b is the embodiment according to FIG. 9a viewed from above.

The capacitive coupling-out is shown in FIG. 9a and FIG. 9b. The two interruption channels 7a and 7b fix the direction of the RF-field $B_{RF}$ of the resonator to be perpendicular to the plane passing through the two interruption channels. Two metallic foils 14a and 14b (e.g. made from copper, aluminum or silver) are attached in an electrically insulating fashion over the pressing device 4b and the two interruption channels. They constitute two coupling capacitors acting between the foils and the superconducting components. Since the resonator has an electrically symmetric configuration, a capacitive coupling network 15a, 15b and 15c is likewise symmetrically configured. Passage of the NMR-signal is effected via a low-ohmic coaxial lead 16 of e.g. 50 Ohm. In order for the symmetry requirements of the coupling network to be satisfied, the capacitor 15b must be approximately equal to the sum of the two capacitors 15a and 15c. The degree of coupling to the coaxial lead 16 can be adjusted via the ratio of the two capacitors 15a and 15c.

Figure 10:
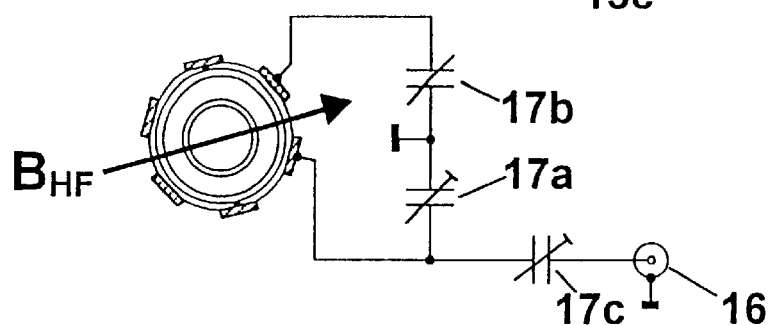
FIG. 10 shows a schematic view from above of an embodiment having conductive coupling-out.

FIG. 10 shows a conductive coupling-out. Contacts are located directly on the two superconducting components 1b and 1c disposed symmetrically with respect to the direction of the $B_{RF}$-field. A coupling-out network 17a, 17b and 17c can be selected in the same fashion as the capacitive coupling-out.

Figure 11A:
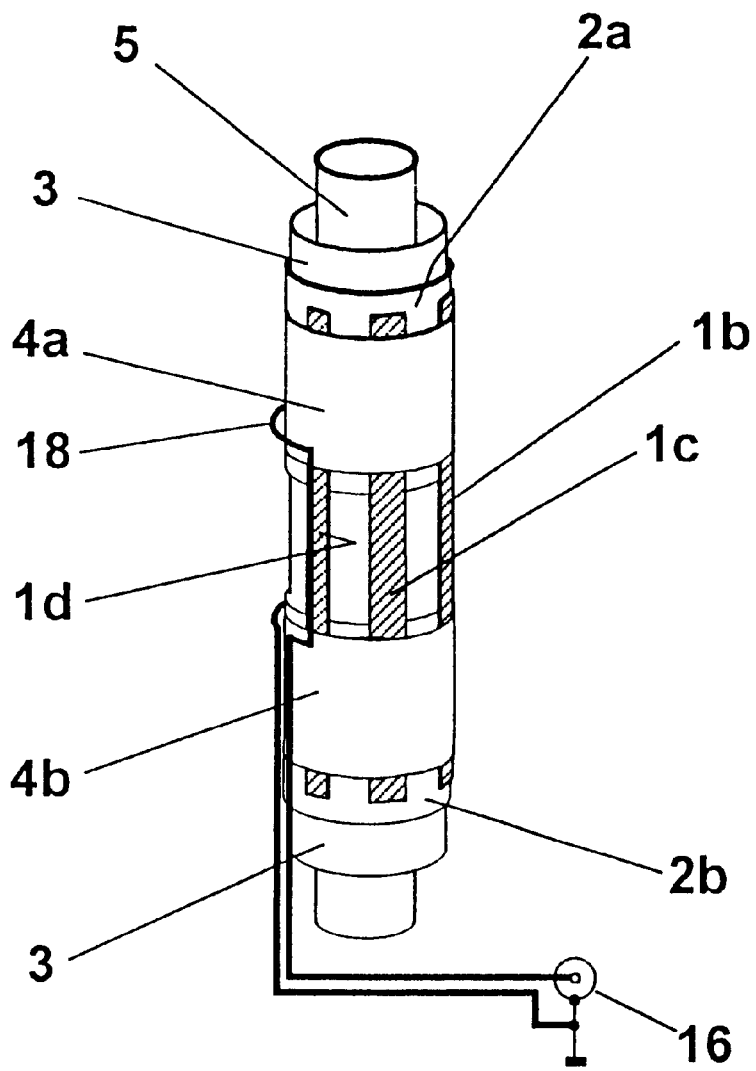
FIG. 11a shows an embodiment having inductive coupling-out.
Figure 11B:
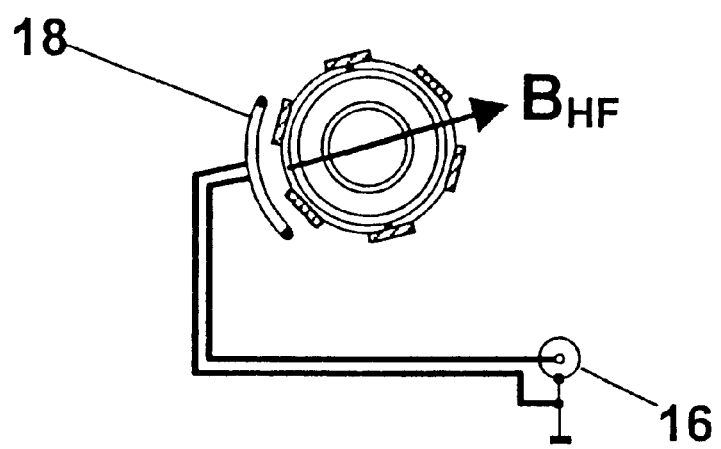
FIG. 11b shows the embodiment of FIG. 11a schematically viewed from above.

FIGS. 11a and 11b show an inductive coupling-out. An inductive loop 18 is disposed at the side of the resonator in such a fashion that the area of the loop is perpendicular to the direction of the $B_{RF}$-field. Displacement and rotation of the loop allow for a change in the coupling to the resonator. The resonant frequency of the resonator must be adjusted with additional means not shown in the drawing. These could e.g. be a cylindrical metallic ring disposed in the vicinity of the connecting rings 2a and 2b over the pressing device 4a which can be displaced in an axial direction to produce a changeable capacitive load on the resonators for adjusting the resonator frequency.

Figure 18:
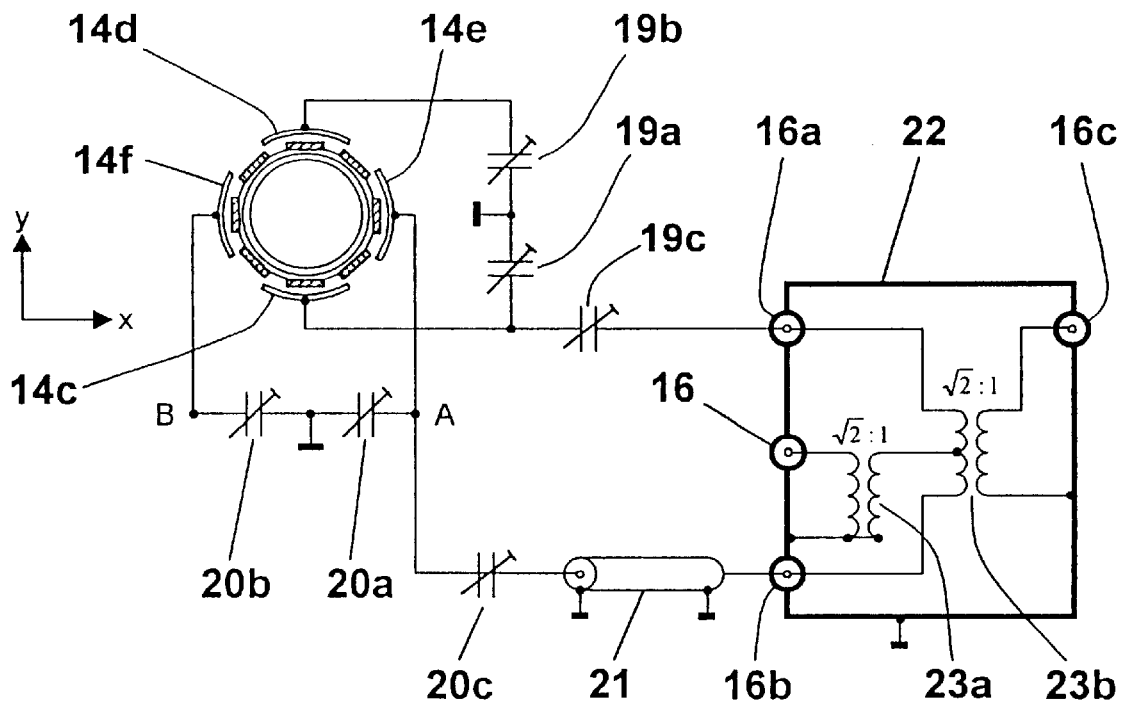
FIG. 18 shows an electrical circuit for coupling-out signals in quadrature from an RF-resonator of the "Bird Cage" type in accordance with the invention.

As already mentioned above, the "Bird Cage" resonator can also be used as a quadrature detector for detecting the rotating fields. This possibility is facilitated by its symmetrical construction which permits two mutually perpendicular, identical out-couplings 14c and 14d as well as 14e and 14f (see FIG. 18) which are electrically and magnetically decoupled from another. The NMR-field rotates in the xy-plane and produces two NMR-signals on the two capacitive out-couplings which are displaced by 90° in time with respect to each other. These two NMR-signals are transformed with the assistance of capacitors 19a, 19b and 19c as well as 20a, 20b and 20c, down to 50 Ohms impedance and subsequently passed to the RF-sockets 16a and 16b of a power-splitter/combiner 22 where the two NMR-signals are added and passed to the output socket 16. The output-socket is connected to the preamplifier (not shown).

As already mentioned, the two NMR-signals are phase-shifted with respect to each other by 90°. In order to take full advantage of the power of the two NMR-signals the two signals must be added together in phase. One of the signals must therefore be additionally phase shifted by 90°. This can be done with the help of a λ/4-conductor 21. In addition, the two NMR-signals at the RF-sockets 16a and 16b can, depending on the rotation direction of the rotating NMR-field, either be in phase or of opposite phase. In the case of opposite phase, both signals would completely cancel each other which must, of course, be prevented. If this is the case, the capacitor 20c must then be connected to point B and not to point A.

This quadrature detection, facilitates coupling of twice the signal power out of the resonator leading to a factor $\sqrt{2}$ increase in the S/N-ratio.

Figure 19:
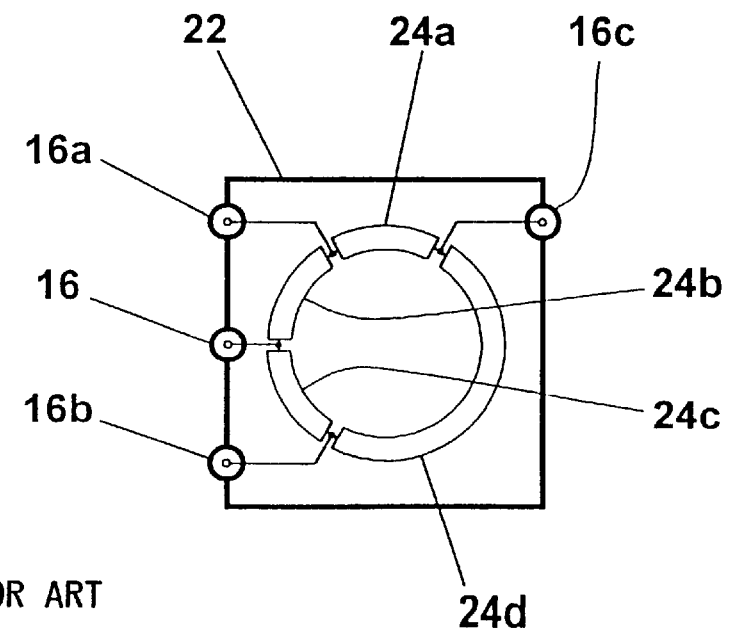
FIG. 19 shows an electrical circuit diagram of a differential transformer according to prior art (Meinke/Gundlach)

The power-splitter/combiner 22 consists essentially of two ideal transformers 23a and 23b and substantially represents a symmetric bridge circuit which completely decouples the transmitter signal at the input socket 16c from the NMR-signal on the output-socket 16 and which also sums together the power of the two NMR-signals at the sockets 16a and 16b without losses and passes same to the output 16. In addition, the available transmitting power at socket 16c is distributed evenly and without losses onto the two sockets 16a and 16b which are connected via the capacitive network to the resonator. The ideal transformers must be replaced by practically realizable circuits. For RF-applications, suitable circuits are those constructed using RF-conductors, e.g. ring-shaped RF-leads (so-called ring-conductors). The textbook "Pocket Hand-Book of Radio-Frequency Technology" by Meinke/Gundlach, chapter "Parallel-Switched Conductors and Ring-Conductors" FIG. 14.7, describes such a differential transformer having a ring-conductor. This is also shown in FIG. 19 in such a fashion as to facilitate a direct comparison to the ideal circuit of FIG. 18. The ring-conductor consists essentially of three λ/4-conductors 24a, 24b, 24c and a 3λ/4-conductor 24d, wherein all four conductors have a common impedance which is a factor of $\sqrt{2}$ larger (e.g. 71 Ohms) than the impedance of the λ/4-conductor 21 and of the two conductors connected to the sockets 16 and 16c (e.g. 50 Ohms).

Figures 20A, 20B:
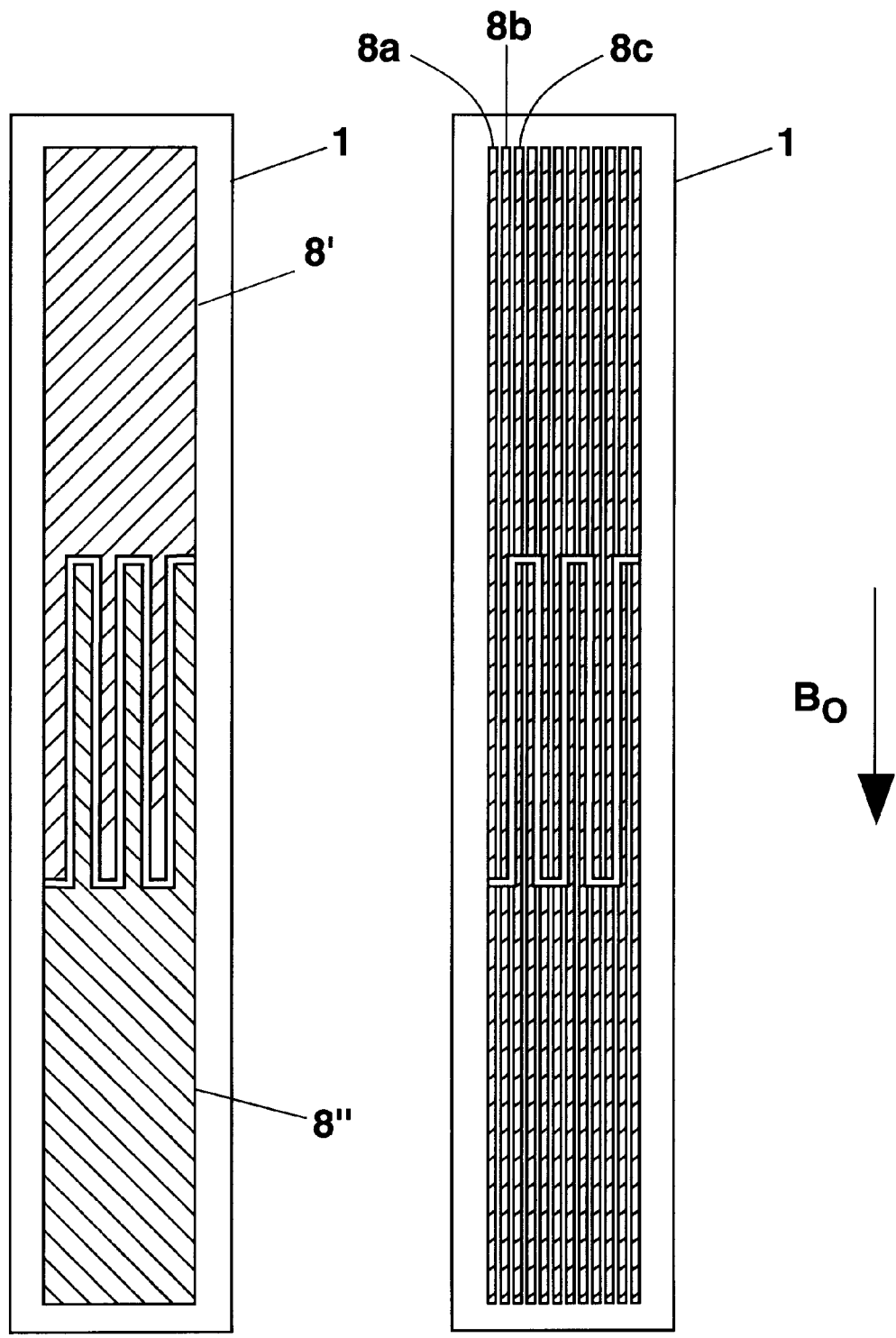
FIG. 20a shows two conductively separated capacitively coupled superconducting layers.
FIG. 20b is similar to FIG. 20a, but with a superconducting layering subdivided into fine strips.

Up to this point, only superconducting components 1, 1a, 1b have been described which, seen in isolation, are conductively connected and divided into fine strips 8a, 8b, 8c, . . . . The capacitive portion of the resonator is formed on the ends of the superconducting components, where they come in contact with the connecting rings 2a and 2b. This, however, must not necessarily be the case, since capacitive components can also be integrated into the superconducting layer 8 of the superconducting components as shown in FIGS. 20a and 20b. The capacitance values described between the superconducting components and the connecting rings can thereby be eliminated and the two components can be conductively connected to each other. The superconducting layer can e.g. consist essentially of two conductively separated parts 8' and 8" in interlocking finger-like engagement to produce a capacitive coupling. FIG. 20a shows a possible configuration. From the electrical point of view, the two components 8' and 8" are two capacitively coupled inductances. The ends of the two components 8' and 8" are connected in a conductive manner to the connecting rings 2a and 2b. Instead of a conducting connection, a capacitive connection is also possible, wherein the capacitance of this connection is preferentially larger or very much larger than the finger-like capacitance.

FIG. 20b shows another way in which the two superconducting coatings 8' and 8" can be subdivided into fine strips 8a, 8b, 8c, . . . to keep the magnetization of the superconductor low.

It is also possible to introduce a plurality of finger-like capacitances onto the superconducting layer which are all electrically connected in series.

In closing, one should also discuss the interfering influences of superconducting materials. The superconducting layer 8 conducts not only the desired RF-currents, but also D.C. currents occurring due to the magnetization of the superconductor in the static $B_0$-field. The superconducting layer can thereby induce significant degeneration of the homogeneity of the magnetic field in dependence on its mass, geometrical shape and orientation. Certain rules must therefore be observed as summarized in the following five points. Reference below to currents refers to D.C. currents associated with the magnetization of the superconductor.

1) The superconducting layer should be as thin as possible, since its influence on the homogeneity of the $B_0$-field increases with increasing mass. The layer should, however, be sufficiently thick that the RF-currents which occur can flow freely. However, a thickness of approximately 0.5 μm is usually sufficient.

Figure 4A:
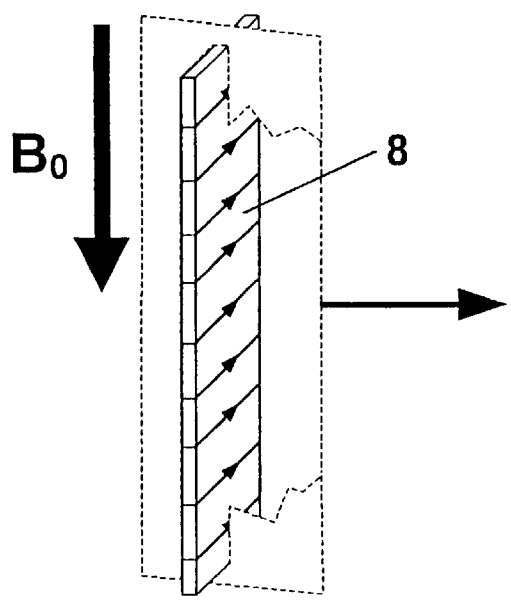
FIG. 4a shows a superconducting layer of a superconducting component directing parallel to the magnetic field $B_0$.
Figure 4B:
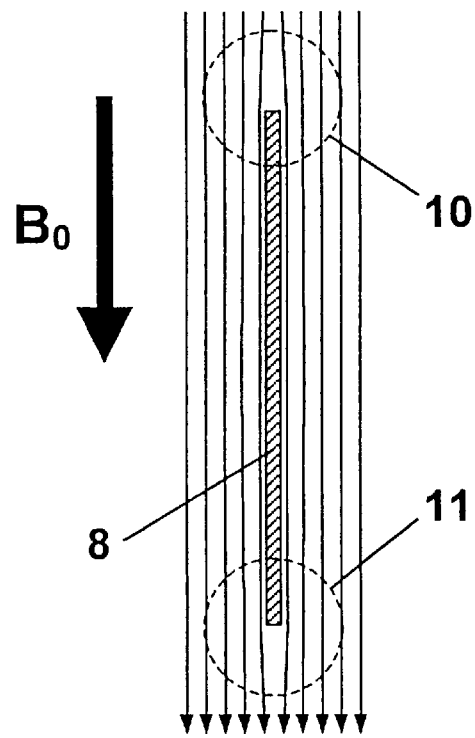
Figure 5A:
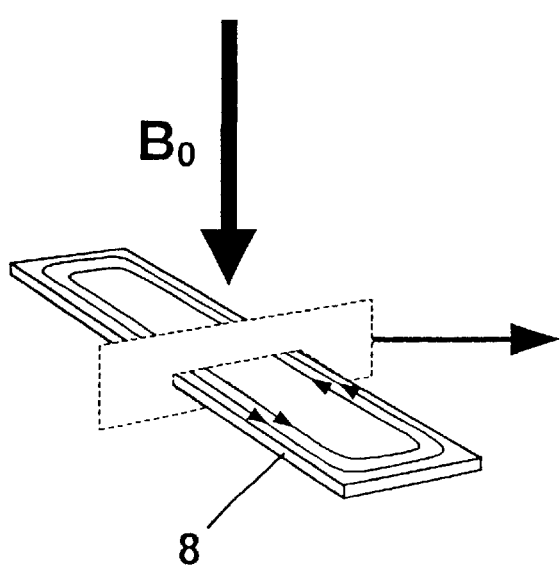
FIG. 5a shows a superconducting layer directed perpendicular to the magnetic field $B_0$.
Figure 5B:
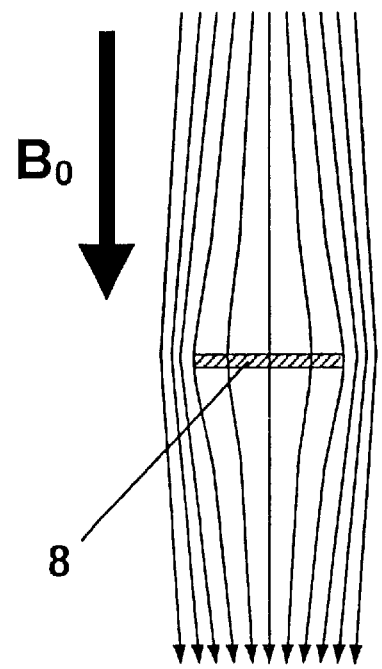

2) The superconducting layer 8 should be as parallel to the $B_0$-field of the NMR-magnet as possible to thereby have as small an influence as possible on the homogeneity of the $B_0$-field at the location of the sample 5. This is shown in FIGS. 4a and 4b as well as in FIGS. 5a and 5b. FIG. 4b shows a superconducting layer 8 which is oriented parallel to the $H_0$-field and which produces practically no field-inhomogeneities. If, in contrast thereto, the superconducting layer is transverse to the $H_0$-field, as shown in FIG. 5b, then strong field inhomogeneities result.

3) If point 2 is fulfilled, then it is the longitudinally directed ends 10, 11 of the superconducting layer 8 which still produce field-inhomogeneities in the $H_0$-field. For this reason, they should be located as far away from the active volume region of the sample 5 as possible. FIG. 4b shows such inhomogeneities at the upper and lower end portions which, however, have only very weak influence. FIG. 1a facilitates an estimate of the active volume region of the sample 5 lying between the connecting rings 2a and 2b of the resonator. The volume region of the sample 5 disposed inside the two connecting rings 2a and 2b is not included, since the two rings have a shielding effect on the sample 5 and prevent RF-excitation at these locations. FIG. 1a clearly shows that the ends of the superconducting components 1b, 1c and 1d are very far removed from the active volume region of the sample 5.

4) The requirements of point 2 cannot be exactly met in practice. One always has to accept a certain small misalignment of the superconducting layer 8 relative to the $H_0$-field. As result thereof, large area circular currents occur along the four sides of the layer which could produce unwanted field-inhomogeneities at the location of the sample.

Figures 8A, 8B:
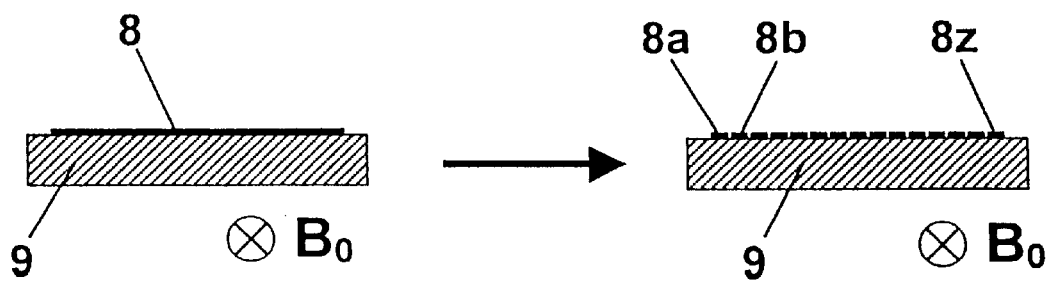
FIG. 8a shows a cross-section through a superconducting component having a continuous superconducting coating parallel to the magnetic field $B_0$.
FIG. 8b is similar to FIG. 8a, but with a superconducting layering subdivided into parallel strips.

In order to weaken this effect, the superconducting layer 8 is subdivided into as many individual mutually separated strips 8a, 8b, . . . , 8z, parallel to the field $H_0$, as possible (see FIGS. 8a and 8b). The circular currents are thereby forced to short-out within the narrow strips and therefore have substantially less influence on the homogeneity of the $H_0$-field.

5) Since the superconducting layer 8 is not made from an ideally homogeneous material, regions having differing critical currents occur. This leads to an inhomogeneous distribution of the current paths in the superconductor which, for their part, produce field-gradients at the location of the sample to thereby worsen the homogeneity of the $H_0$-field. These interfering effects can also be strongly suppressed by the subdivision into a plurality of individual strips already described in point 4 above.

6) So-called shim-coils are used in high-resolution NMR-spectroscopy which comprise differing coil configurations having individually adjustable current flow. These shim-coils generate additional magnetic fields to produce a homogeneous $H_0$-field. The additional magnetic fields must not be parallel to the superconducting layer 8, but can also be directed perpendicular thereto. They thereby produce relatively large area current loops in this layer which cause strong inhomogeneities at the location of the sample. The subdivision of the superconductor into a plurality of fine strips, as already described in point 3 above, can also largely obviate this problem, since only small area circulating currents of reduced current strength can thereby occur having a substantially smaller influence on the homogeneity of the $H_0$-field.

I claim:

1. A radio-frequency (RF)-resonator for resonant transmission and reception of RF-signals at a desired resonance frequency into and out of a sample in an investigational volume within a homogeneous magnetic field $B_0$ of a nuclear magnetic resonance(NMR)-apparatus, the RF-resonator comprising:

at least two spatially separated superconducting components; and normally conducting connection elements coupling together said superconducting components, wherein said superconducting components do not form, either individually or collectively, a closed resonance system capable of resonating at the desired resonance frequency, and said superconducting components, together with said normally connecting elements, form at least one closed resonance system capable of resonating at the desired resonance frequency.

2. The RF-resonator of claim 1, wherein said superconducting layer is subdivided into a plurality of fine strips all of which are directed parallel to the magnetic field $B_0$.

3. The RF-resonator of claim 1, wherein said superconducting layer is subdivided into at least two regions which are capacitively coupled to each other.

4. The RF-resonator of claim 1, wherein said superconducting layer consists essentially of a high temperature superconductor.

5. The RF-resonator of claim 4, wherein said high temperature superconductor consists essentially of YBCO.

6. The RF-resonator of claim 1, wherein said plate consists essentially of a crystal having a crystal structure.

7. The RF-resonator of claim 6, wherein said crystal is one of $LaAlO_3$ and sapphire.

8. The RF-resonator of claim 1, wherein said the connection elements have two diametrically opposed interruption channels which extend parallel to said axis of said cylindrical surface to effect a predefined current distribution in the resonator.

9. The RF-resonator of claim 8, wherein there are 2 m superconducting components, with m being an odd integer, and said interruption channels are disposed in a middle below a superconducting component.

10. The RF-resonator of claim 8, wherein there are 2 m superconducting components, with m being an even integer, and said interruption channels are disposed in a middle between two neighbouring superconducting components.

11. The RF-resonator of claim 1, wherein said superconducting components and said connection elements form a Bird Cage resonator.

12. The RF-resonator of claim 11, further comprising a capacitive out-coupling for coupling an NMR-signal out of the resonator.

13. The RF-resonator of claim 11, further comprising a conductive out-coupling for coupling an NMR-signal out of the resonator.

14. The RF-resonator of claim 13, wherein said conductive out-coupling comprises a direct contacting to said supercondcuting component.

15. The RF-resonator of claim 11, further comprising two mutually orthogonal out-couplings to facilitate quadrature detection.

16. A radio-frequency (RF) resonator for resonant transmission and reception of RF-signals at a desired resonance frequency into and out of a sample in an investigational volume within a homogeneous magnetic field $B_0$ of a nuclear magnetic resonance (NMR) apparatus, the RF-resonator comprising:

at least two spatially separated superconducting components, each of said superconducting components consisting essentially of an elongated narrow plate having a superconducting layer, said plate being oriented parallel to the magnetic field $B_0$ and distributed on a cylindrical surface having an axis parallel to the magnetic field $B_0$ and coinciding with an axis of the sample; and normally conducting connection elements coupling together said superconducting components, wherein said superconducting components do not form, either individually or collectively, a closed resonance system capable of resonating at the desired resonance frequency, and said superconducting components, together with said normally conducting elements, form at least one closed resonance system capable of resonating at the desired resonance frequency.

17. A radio-frequency (RF) resonator for resonant transmission and reception of RF-signals at a desired resonance frequency into and out of a sample in an investigational volume within a homogeneous magnetic field $B_0$ of a nuclear magnetic resonance (NMR) apparatus, the RF-resonator comprising:

at least two spatially separated superconducting components, each of said superconducting components consisting essentially of an elongated narrow plate having a superconducting layer, said plate being oriented parallel to the magnetic field $B_0$ and distributed on a cylindrical surface having a axis parallel to the magnetic field $B_0$ and coinciding with an axis of the sample; and normally conducting connection elements coupling together said superconducting components, wherein said superconducting components do not form, either individually or collectively, a closed resonance system capable of resonating at a desired resonance frequency, and said superconducting components, together with said normally conducting elements, form at least one closed resonance system capable of resonating at a desired resonance frequency, wherein said superconducting components are at least one of capacitively and conductively connected, at their two axial ends, to normally conducting, metallic connection elements having high electrical conductivity.

* * * * *